United States Patent
Morioka et al.

(10) Patent No.: US 9,671,573 B2
(45) Date of Patent: Jun. 6, 2017

(54) LIGHT RECEPTACLE AND LIGHT MODULE

(71) Applicant: Enplas Corporation, Saitama (JP)

(72) Inventors: Shimpei Morioka, Saitama (JP); Kazutaka Shibuya, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/111,708

(22) PCT Filed: Jan. 6, 2015

(86) PCT No.: PCT/JP2015/050085
§ 371 (c)(1),
(2) Date: Jul. 14, 2016

(87) PCT Pub. No.: WO2015/107923
PCT Pub. Date: Jul. 23, 2015

(65) Prior Publication Data
US 2016/0327758 A1 Nov. 10, 2016

(30) Foreign Application Priority Data
Jan. 15, 2014 (JP) .................................. 2014-004967

(51) Int. Cl.
G02B 6/32 (2006.01)
G02B 6/42 (2006.01)
(Continued)

(52) U.S. Cl.
CPC ........ G02B 6/4206 (2013.01); B29C 45/0025 (2013.01); B29C 45/40 (2013.01);
(Continued)

(58) Field of Classification Search
CPC ...... G02B 6/32; G02B 6/4206; G02B 6/4214; G02B 6/425; G02B 6/4255; G02B 6/4257
(Continued)

(56) References Cited

U.S. PATENT DOCUMENTS

2006/0164738 A1   7/2006  Yamamoto et al.
2015/0010272 A1*  1/2015  Tanazawa ............ G02B 6/4286
                                                          385/31

FOREIGN PATENT DOCUMENTS

JP    1-139518 A      9/1989
JP    2005-031556 A   2/2005
(Continued)

OTHER PUBLICATIONS

International Search Report from International Application No. PCT/JP2015/050085 mailed Mar. 31, 2015.

*Primary Examiner* — Jerry Blevins
(74) *Attorney, Agent, or Firm* — Brundidge & Stanger, P.C.

(57) ABSTRACT

This light receptacle comprises: first optical surfaces on which light beams emitted from light emitting elements are respectively caused to be incident; second optical surfaces which emit the light beams incident on first optical surfaces respectively toward the end faces of light transmission bodies; a third optical surface which reflects the light beams incident on the first optical surfaces toward the second optical surfaces; and recesses which are formed in the surface on which second optical surfaces are arranged. The distance between the centers of two adjacent first optical surfaces before mold release and the distance between the centers of two adjacent second optical surfaces before mold release during injection molding are shorter than the distance between the optical axes of light beams emitted from two adjacent light emitting elements that are arranged so as to face each other.

2 Claims, 9 Drawing Sheets

(51) Int. Cl.
*B29C 45/40* (2006.01)
*H01S 5/022* (2006.01)
*B29C 45/00* (2006.01)

(52) U.S. Cl.
CPC ............... *G02B 6/32* (2013.01); *G02B 6/425* (2013.01); *G02B 6/4214* (2013.01); *G02B 6/4249* (2013.01); *G02B 6/4255* (2013.01); *G02B 6/4257* (2013.01); *H01S 5/022* (2013.01)

(58) Field of Classification Search
USPC .......................................................... 385/33
See application file for complete search history.

(56) References Cited

FOREIGN PATENT DOCUMENTS

| | | | |
|---|---|---|---|
| JP | 2009-003171 A | 1/2009 | |
| JP | 2009-163213 A | 7/2009 | |
| JP | 2009-229996 A | 10/2009 | |
| JP | 2012-108443 A | 6/2012 | |

* cited by examiner

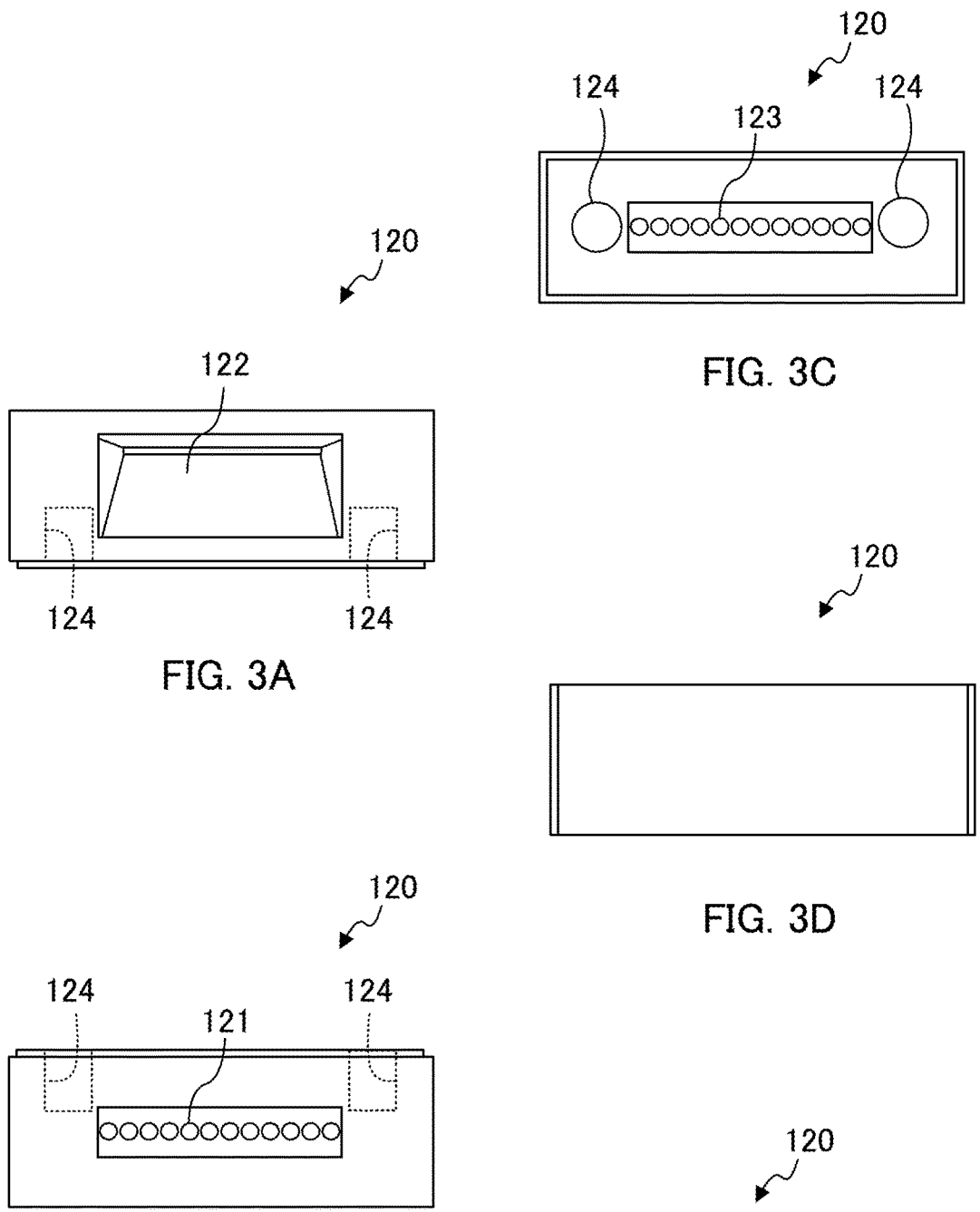

LIGHT RECEPTACLE AND LIGHT MODULE

TECHNICAL FIELD

The present invention relates to an optical receptacle and an optical module including the same.

BACKGROUND ART

In optical communications using optical transmission members such as optical fibers and light waveguides, optical modules have been used, provided with a light emitting element such as a surface-emitting laser (for example, Vertical Cavity Surface Emitting Laser: VCSEL). Such an optical module includes an optical receptacle for transmission which allows light including communication information emitted from a light emitting element to enter an optical transmission member, or an optical receptacle for reception which allows light from an optical transmission member to enter a light receiving element (see, e.g., Patent Literature (hereinafter, referred to as PTL) 1).

FIG. 1 is a perspective view of optical receptacle 10 for reception disclosed in PTL 1. As illustrated in FIG. 1, optical receptacle 10 includes a plurality of incidence surfaces 12 on which light from a plurality of optical fibers is incident, reflection surface 14 reflecting the light incident on the plurality of incidence surfaces 12, a plurality of emission surfaces 16 emitting the light reflected by reflection surface 14 toward a plurality of light receiving elements, and a pair of guide holes 18 disposed so as to have reflection surface 14 therebetween. The plurality of optical fibers are housed in an optical connector, and the plurality of optical fibers are connected to optical receptacle 10 by inserting protrusions of the optical connector into guide holes 18.

In optical receptacle 10 with the optical fibers connected thereto, light emitted from the optical fibers is incident on incidence surfaces 12, reflected by reflection surface 14 toward the light receiving surfaces of the light receiving elements, and then emitted from emission surfaces 16 to reach the light receiving surfaces of the light receiving elements.

Optical receptacle 10 disclosed in PTL 1 is molded integrally by injection molding with a transparent thermoplastic resin. Specifically, optical receptacle 10 is produced by injecting a transparent thermoplastic resin into a mold cavity, solidifying the resin, and subsequently releasing optical receptacle 10 from the mold.

CITATION LIST

Patent Literature

PTL 1
Japanese Patent Application Laid-Open No. 2005-031556

SUMMARY OF INVENTION

Technical Problem

When optical receptacle 10 disclosed in PTL 1 is produced by injection molding, the mold is not easily released from guide holes 18, which causes deforming of reflection surface 14 at the time of releasing from the mold. Reflection surface 14 deformed at the time of releasing from the mold cannot return to the shape before release from the mold. Therefore, optical receptacle 10 of PTL 1 produced by injection molding has a disadvantage such that optical receptacle 10 cannot properly guide light emitted from optical fibers to the light receiving surfaces of light receiving elements.

An object of the present invention is to provide an optical receptacle that can optically connect light emitting elements or light receiving elements to optical transmission members even when a reflection surface deforms during production of the optical receptacle by injection molding. Another object of the present invention is to provide an optical module including the optical receptacle.

Solution to Problem

An optical receptacle of the present invention is produced by injection molding, disposed between a plurality of light emitting elements or a plurality of light receiving elements and a plurality of optical transmission members, and configured to optically connect the light emitting elements or the light receiving elements to end surfaces of the optical transmission members, respectively, the optical receptacle comprising: a plurality of first optical surfaces each configured such that light emitted from a corresponding one of the light emitting elements is incident on the first optical surface, or configured to emit light propagating inside the optical receptacle toward a corresponding one of the light receiving elements; a plurality of second optical surfaces each configured to emit the light incident on the first optical surface toward an end surface of a corresponding one of the optical transmission members, or configured such that light from a corresponding one of the optical transmission members is incident on the second optical surface; a third optical surface configured to reflect the light incident on the first optical surface toward the second optical surface, or configured to reflect the light incident on the second optical surface toward the first optical surface; and a plurality of recesses formed on a surface where the plurality of second optical surfaces are disposed, wherein, before release from a mold in the injection molding, a center-to-center distance of adjacent two of the first optical surfaces and a center-to-center distance of adjacent two of the second optical surfaces are shorter than a distance between optical axes of light emitted from oppositely-disposed adjacent two of the light emitting elements, or a distance between optical axes of light emitted from oppositely-disposed adjacent two of the optical transmission members.

An optical module of the present invention includes a substrate on which a plurality of light emitting elements or light receiving elements are disposed, and the optical receptacle of the present invention disposed on the substrate.

Advantageous Effects of Invention

According to the present invention, a plurality of light emitting elements or light receiving elements can be optically connected properly to a plurality of optical transmission members even when deformation occurs during production by injection molding.

BRIEF DESCRIPTION OF DRAWINGS

FIGS. 3A to 3E illustrate a configuration of an optical receptacle according to the embodiment;

DESCRIPTION OF EMBODIMENTS

Hereinafter, embodiments of the present invention will be described in detail with reference to the accompanying drawings.

Configuration of Optical Module

Figure 1:
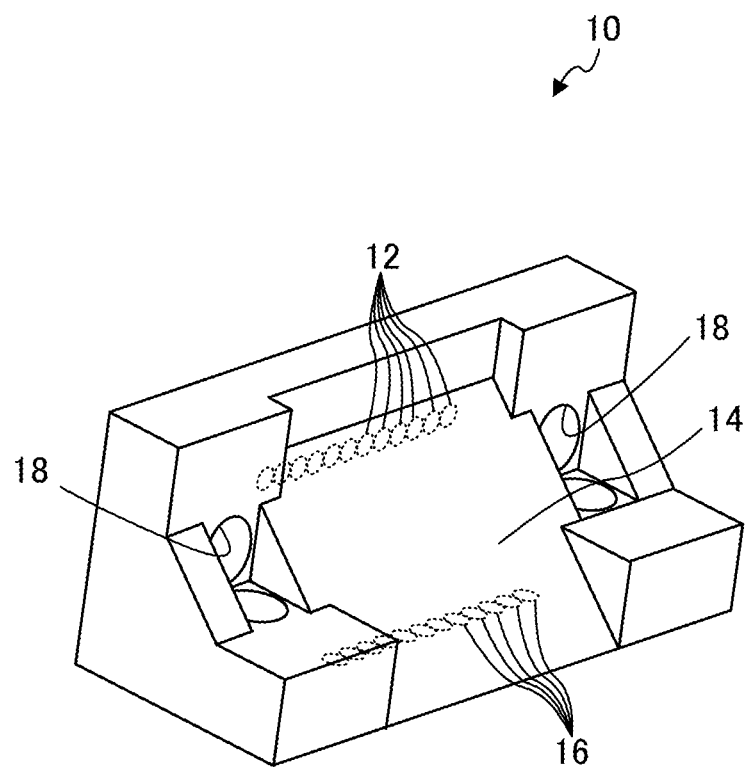
FIG. 1 is a perspective view of an optical receptacle according to PTL 1.
Figure 2:
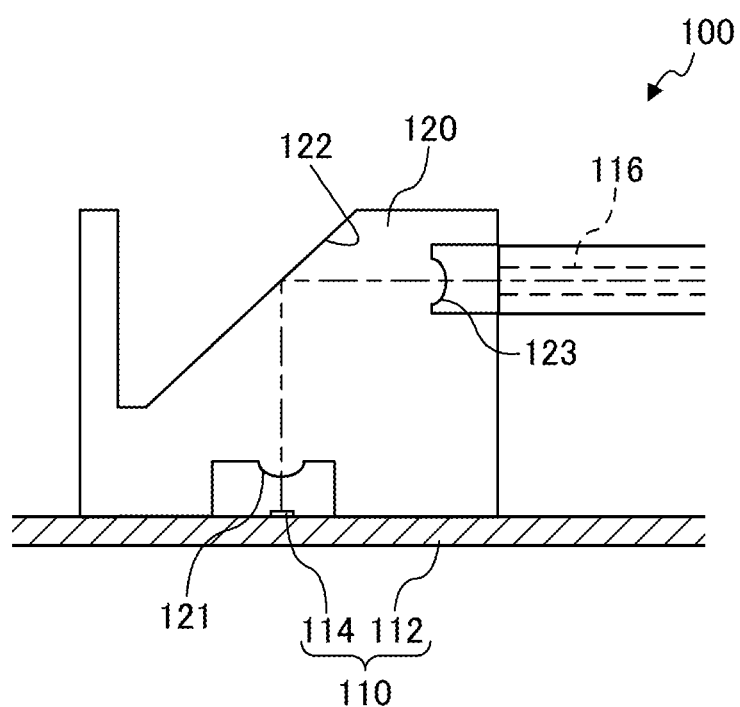
FIG. 2 is a cross-sectional view of an optical module according to an embodiment.

FIG. 2 is a cross-sectional view of optical module 100 according to an embodiment of the present invention. FIG. 2 omits hatching in the cross-section of optical receptacle 120 to show an optical path in optical receptacle 120.

As shown in FIG. 2, optical module 100 includes substrate-mounted photoelectric conversion device 110 including light emitting elements 114, and optical receptacle 120. Optical module 100 is used in a state where optical receptacle 120 is connected to optical transmission members 116. Optical transmission member 116 is not limited to any particular type and may be an optical fiber or a light waveguide, for example. In the present embodiment, optical transmission members 116 are optical fibers. The optical fibers may be single-mode optical fibers or multi-mode optical fibers.

Photoelectric conversion device 110 includes substrate 112 and a plurality of light emitting elements 114. Light emitting elements 114 are disposed in a line on substrate 112, and configured to emit laser light in the direction perpendicular to the surface of substrate 112. Light emitting element 114 is, e.g., Vertical Cavity Surface Emitting Laser (VCSEL).

Optical receptacle 120 optically connects light emitting elements 114 to the end surfaces of optical transmission members 116 in the state of being disposed between photoelectric conversion device 110 and optical transmission members 116. A configuration of optical receptacle 120 will be described in detail.

Configuration of Optical Receptacle

FIGS. 3A to 3E illustrate a configuration of optical receptacle 120 according to the embodiment. FIGS. 3A to 3E are, respectively, a plan view, a bottom view, a front view, a back view and a right side view of the optical receptacle 120.

As illustrated in FIGS. 3A to 3E, optical receptacle 120 is a member with the shape of a substantially rectangular parallelepiped. Optical receptacle 120 is light transmissive and configured to emit light emitted from light emitting elements 114 toward the end surfaces of optical transmission members 116. Optical receptacle 120 includes a plurality of first optical surfaces (incidence surfaces) 121, third optical surface (reflection surfaces) 122, a plurality of second optical surfaces (emission surfaces), and a plurality of recesses 124. Optical receptacle 120 is formed of a material that transmits light having a wavelength used for optical communications. Examples of such materials include transparent resins such as polyetherimides (PEI) and cyclic olefin resins. As described later, optical receptacle 120 is produced by injection molding.

First optical surface 121 is an incidence surface that refracts laser light emitted from light emitting element 114 to allow the light to enter inside optical receptacle 120. The plurality of first optical surfaces 121 are disposed in a line on the bottom surface of optical receptacle 120 in the longer-side direction so as to face respective light emitting elements 114. First optical surface 121 may be in any shape. The shape of first optical surface 121 is that of convex lens protruding toward light emitting element 114 in the present embodiment. The shape of first optical surface 121 in plan view is a circle. It is preferable that first optical surface 121 is larger than light (light flux) emitted from light emitting element 114. It is preferable that the center-to-center distance of two adjacent first optical surfaces is shorter than the distance between optical axes of light emitted from two adjacent light emitting elements 114 disposed so as to face first optical surfaces 121. The light incident on first optical surface 121 (incidence surface) propagates toward third optical surface 122 (reflection surface).

Third optical surface 122 is a reflection surface that reflects the light incident on first optical surface 121 toward second optical surface 123. Third optical surface 122 is tilted such that the distance from optical transmission member 116 decreases in the direction from the bottom surface to the top surface of optical receptacle 120. The inclination angle of third optical surface 122 relative to the optical axis of light emitted from light emitting element 114 is not particularly limited. It is preferable that the inclination angle of third optical surface 122 is 45° relative to the optical axis of light incident on first optical surface 121. Third optical surface 122 may be in any shape. In the present embodiment, the shape of third optical surface 122 is a flat surface. The light incident on first optical surface 121 is incident on third optical surface 122 at an incident angle larger than the critical angle. Third optical surface 122 totally reflects the incident light toward second optical surface 123. That is, light with a predetermined light flux diameter is incident on third optical surface 122 (reflection surface), and the light with the predetermined light flux diameter is emitted toward second optical surface 123 (emission surface).

Second optical surface 123 is an emission surface that emits the light totally reflected by third optical surface 122 toward the end surface of optical transmission member 116. The plurality of second optical surfaces 123 are disposed in a line on the side surface of optical receptacle 120 in the longer-side direction so as to face respective end surfaces of optical transmission members 116. Second optical surface 123 may be in any shape. In the present embodiment, the shape of second optical surface 123 is that of a convex lens protruding toward the end surface of optical transmission member 116. This enables the light with the predetermined light flux diameter reflected by third optical surface 122 to efficiently connect to the end surface of optical transmission member 116. It is preferable that the center-to-center distance of two adjacent second optical surfaces 123 is shorter than the distance between optical axes of light emitted from two adjacent optical transmission members 116 disposed so as to face second optical surfaces 123.

Recesses 124 are for fixing optical transmission members 116 to optical receptacle 120 (to the surface where the plurality of second optical surface 123 are disposed). Optical transmission members 116 can be fixed to the surface of optical receptacle 120 where the plurality of second optical surfaces 123 are disposed by engaging projections of an optical transmission member attachment with respective recesses 124.

The shape and number of recesses 124 are not particularly limited as long as optical transmission members 116 can be fixed to optical receptacle 120 (to the surface where the plurality of second optical surface 123 are disposed). It is sufficient that the shape of recess 124 is complementary to that of the projection of the optical transmission member attachment. In the present embodiment, the shape of recess 124 is cylindrical. The number of recesses 124 is not limited either, as long as optical transmission member 116 can be fixed to optical receptacle 120, and typically more than one recess are formed.

In the present embodiment, two recesses 124 are disposed on the surface where the plurality of second optical surfaces 123 are disposed so that all of second optical surfaces are interposed between two recesses 124 in the longer-side direction. Recesses 124 are formed at the respective plane symmetrical positions with respect to a plane which is parallel to the optical axis of light passing through second optical surface 123, and perpendicularly divides third optical surface 122 into two portions. The diameter and depth of the opening of recess 124 are not particularly limited either, and it is sufficient that the diameter and depth are complementary to that of the projection of substrate 112.

Method for Producing Optical Receptacle

As described above, optical receptacle 120 according to the present embodiment is produced by injection molding. A method for producing optical receptacle 120 will be described in detail.

Firstly, a mold is clamped. The number of mold pieces and how to split the mold are not particularly limited as long as the mold used for the injection molding has a part corresponding to recess 124 and is capable of molding optical receptacle 120 according to the present embodiment. When the mold is clamped, a cavity having the shape complementary to the optical receptacle as designed is formed in the mold.

Secondly, a molten resin is injected into the cavity inside the mold. The mold is cooled naturally with the pressure being held while the molten resin fills the cavity.

Lastly, the clamped mold is opened and an optical receptacle (injection molded article) 120 is released from the mold.

Figure 4A:
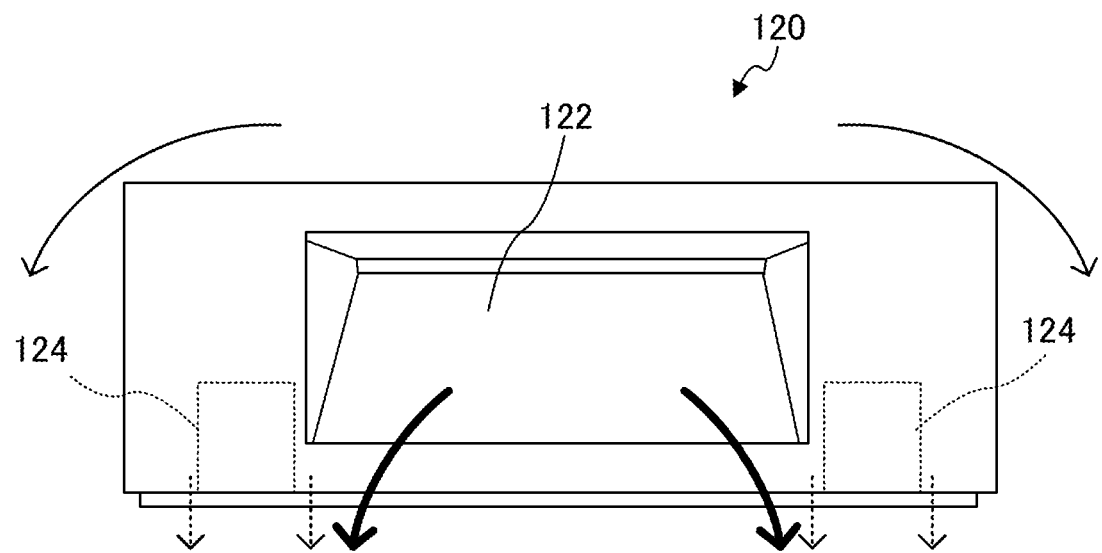
FIGS. 4A and 4B describe deformation of the optical receptacle according to the embodiment.
Figure 4B:
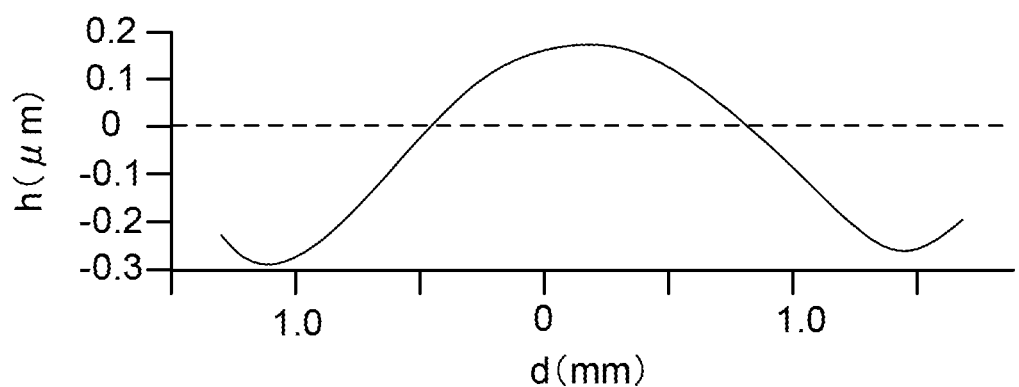

FIGS. 4A and 4B describe deformation of optical receptacle 120 according to the embodiment. FIG. 4A illustrates stress applied to optical receptacle 120 at the time of releasing from the mold. FIG. 4B is a graph illustrating the deformation of third optical surface after the injection molding. In FIG. 4B, the abscissa represents the distance d from the center of third optical surface 122, and the ordinate represents the deformation amount h of third optical surface 122 in the normal direction. When optical receptacle 120 is released from a mold, optical receptacle 120 is pulled toward the mold side at the positions of recesses 124 (downward in FIG. 4A) by friction force (insertion and extraction force) generated between the inner surface of recess 124 and a part of the mold corresponding to recess 124 (see thin dotted lines in FIG. 4A). At this time, the whole of optical receptacle 120 receives stress to be bent (see thin solid lines in FIG. 4A). As a result, all of first optical surfaces 121, second optical surfaces 123 and third optical surface 122 receive force and are bent (see thick solid lines in FIG. 4A) and are released in a deformed state.

As described above, optical receptacle 120 according to the present embodiment is produced by injection molding and receives force to be bent as a whole at the time of releasing from a mold. Therefore, the product design of optical receptacle 120 according to the present embodiment takes the deformation caused by the release from a mold into consideration in advance.

Figure 5A:
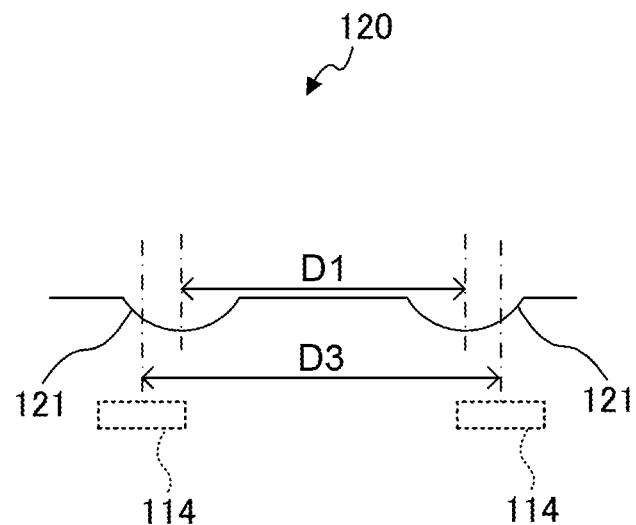
FIGS. 5A and 5B illustrate disposition of first optical surfaces and second optical surfaces in the optical receptacle according to the embodiment before release from a mold.
Figure 5B:
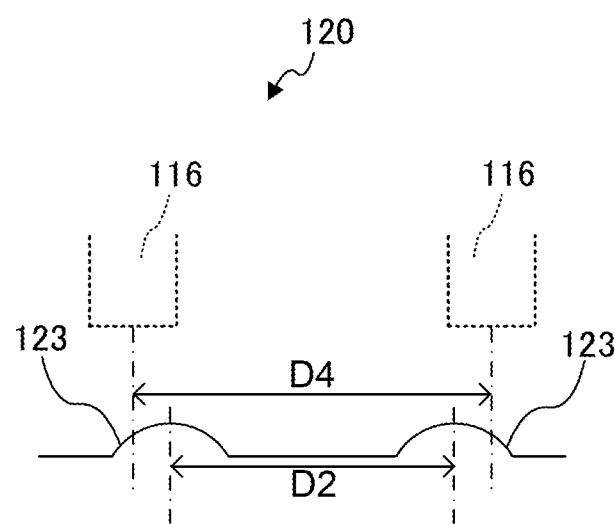

FIGS. 5A and 5B explain disposition of first optical surfaces 121 and second optical surfaces 123 before release from a mold. FIG. 5A explains disposition of first optical surfaces 121 before release from the mold, and FIG. 5B explains disposition of second optical surfaces 123 before release from the mold.

As illustrated in FIGS. 5A and 5B, before release from a mold in the injection molding, the center-to-center distance D1 of two adjacent first optical surfaces 121 and the center-to-center distance D2 of two adjacent second optical surfaces 123 are designed to be shorter than the distance D3 between the optical axes of light emitted from two adjacent light emitting elements 114 disposed so as to face first optical surfaces 121, and the distance D4 between the optical axes of light incident on two adjacent optical transmission members 116 disposed so as to face second optical surfaces 123, respectively. The distance D3 between the optical axes of light emitted from two adjacent light emitting elements 114 is the same as the distance D4 between the optical axes of light incident on two adjacent optical transmission members 116.

Figure 6A:
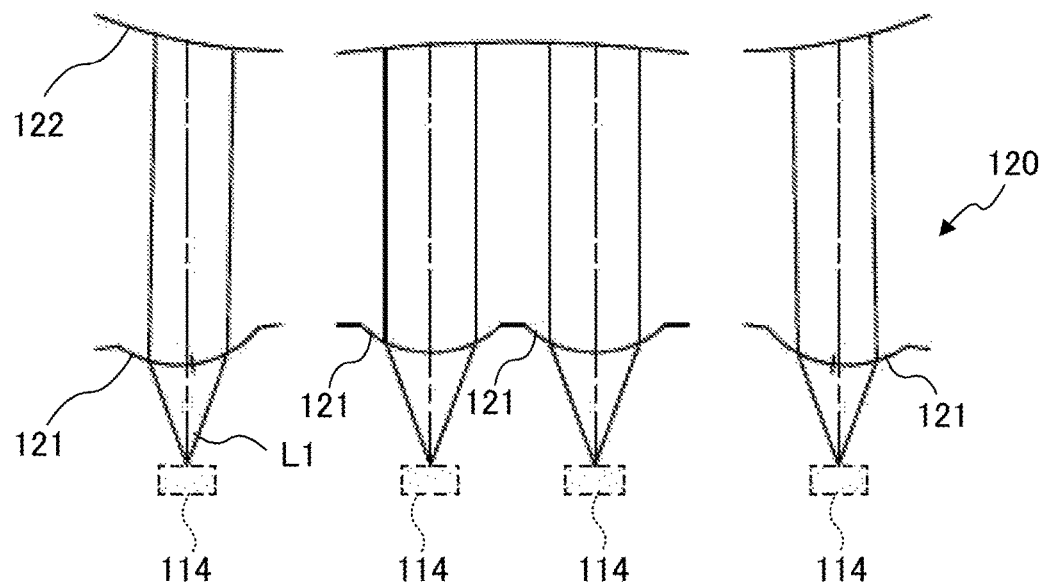
FIGS. 6A and 6B illustrate optical paths in the optical receptacle according to the embodiment after released from the mold.
Figure 6B:
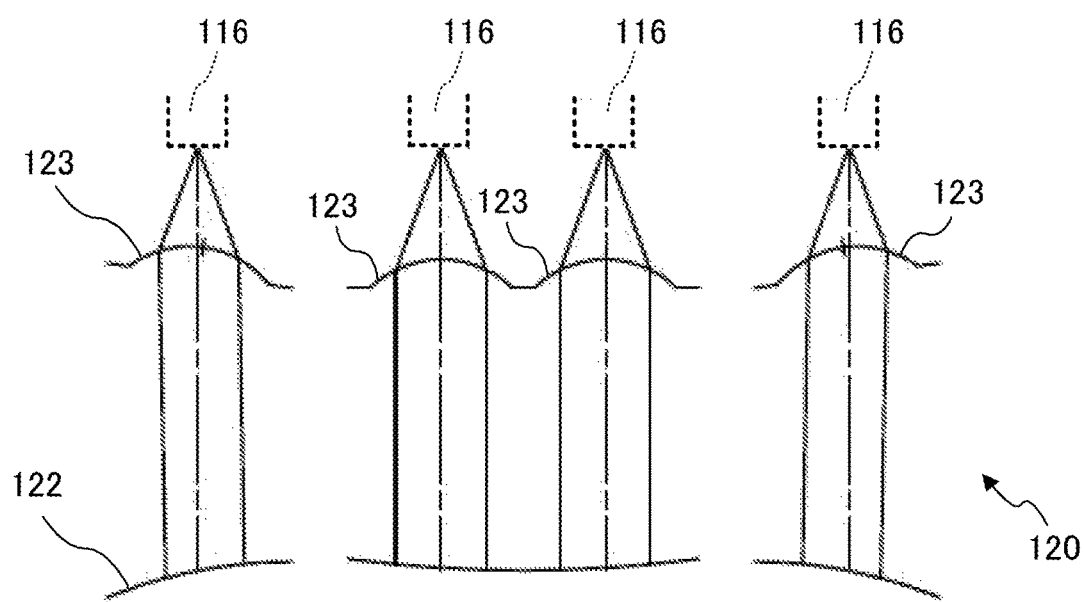

FIGS. 6A and 6B illustrate optical paths in optical receptacle 120 after released from the mold. FIG. 6A illustrates optical paths from light emitting elements 114 to third optical surface 122, and FIG. 6B illustrates optical paths from third optical surface 122 to optical transmission members 116, both in optical receptacle 120 after released from the mold. In FIGS. 6A and 6B, the leftmost first optical surface 121, the central first optical surfaces 121 and the rightmost first optical surface 121 in the drawings respectively represent the leftmost first optical surface 121, the central first optical surfaces 121, and the rightmost first optical surface 121 in FIG. 3B (bottom view).

As illustrated in FIG. 6A, in optical receptacle 120 designed as described above and produced by injection molding, light emitted from the leftmost light emitting element 114 is refracted by first optical surface 121 toward inside relative to the optical axis of the light emitted from light emitting element 114 and enters optical receptacle 120. The light incident on optical receptacle 120 is reflected by third optical surface 122 toward outside relative to the optical axis of the light emitted from light emitting element 114. Light emitted from central light emitting element 114 enters optical receptacle 120 from first optical surface 121. Since central first optical surface 121 is not largely deformed, light incident on central first optical surface 121 propagates in optical receptacle 120 along the optical axis of the light emitted from light emitting element 114. The light incident on optical receptacle 120 is reflected by third optical surface 122 to propagate along the optical axis of the light emitted from light emitting element 114. Light emitted from the rightmost light emitting element 114 is refracted by first optical surface 121 toward inside relative to the optical axis of the light emitted from light emitting element 114 and enters optical receptacle 120. The light incident on optical receptacle 120 is reflected by third optical surface 122 toward outside relative to the optical axis of the light emitted from light emitting element 114.

As illustrated in FIG. 6B, the light emitted from the leftmost light emitting element 114 and reflected by third optical surface 122 is refracted by second optical surface 123 toward the center of the end surface of optical transmission member 116, and is emitted. The light emitted from the central light emitting element 114 and reflected by third optical surface 122 is refracted by second optical surface 123 toward the center of the end surface of optical transmission member 116, and is emitted. The light emitted from the rightmost light emitting element 114 and reflected by third optical surface 122 is refracted by second optical surface 123 toward the center of the end surface of optical transmission member 116, and is emitted. Even after released from a mold in a deformed state, optical receptacle 120 can optically connect light emitting elements 114 to optical transmission members 116 by adjusting the pitch between first optical surfaces 121 and the pitch between second optical surfaces 123.

On the other hand, when the deformation caused by the release from a mold is not taken into consideration as in the present embodiment, failure as described below occurs.

Figure 7A:
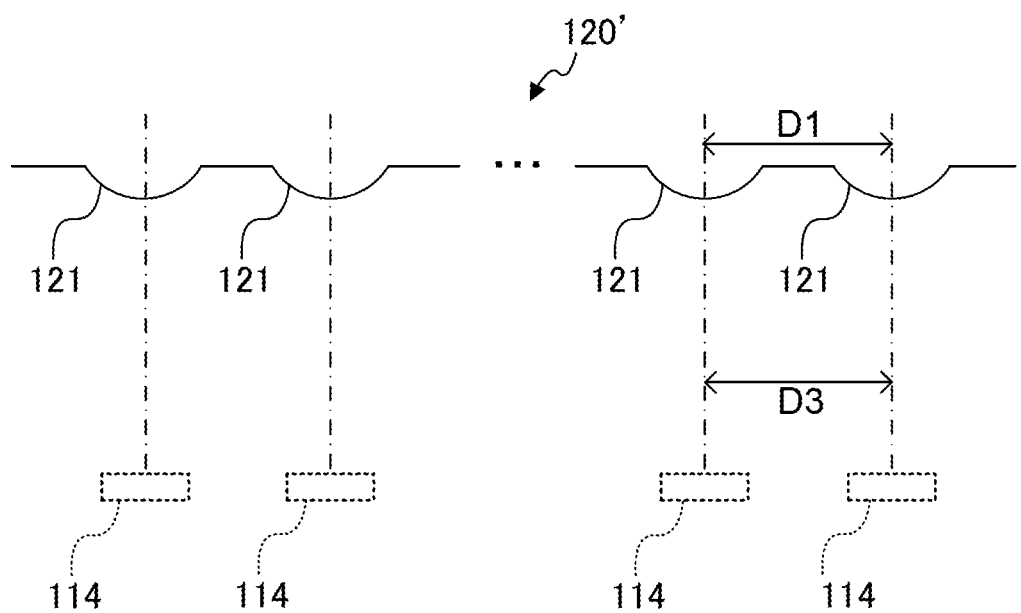
FIGS. 7A and 7B illustrate disposition of first optical surfaces and second optical surfaces in an optical receptacle according to a comparative example before release from a mold.
Figure 7B:
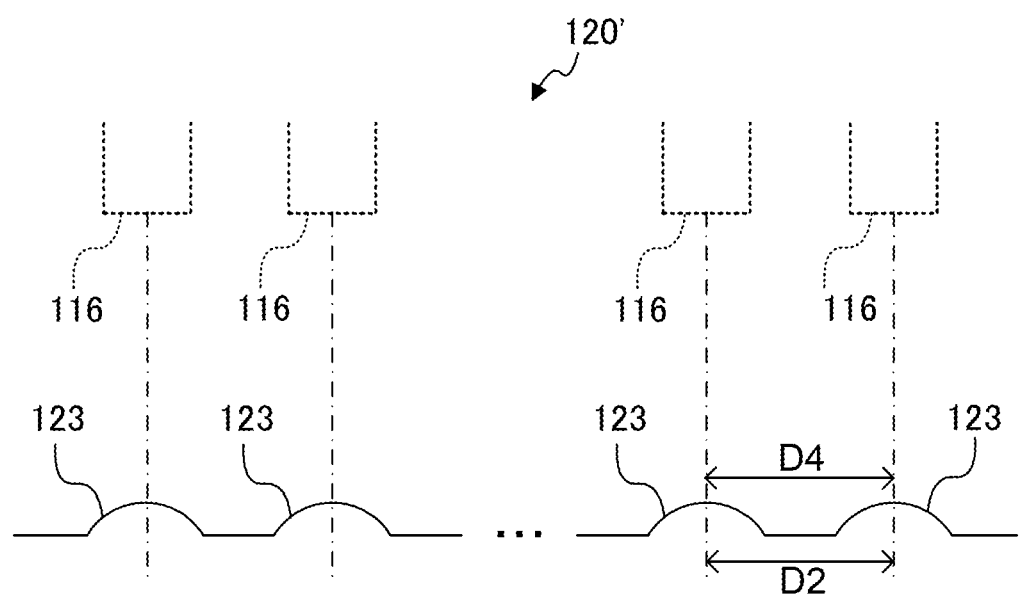
Figure 8A:
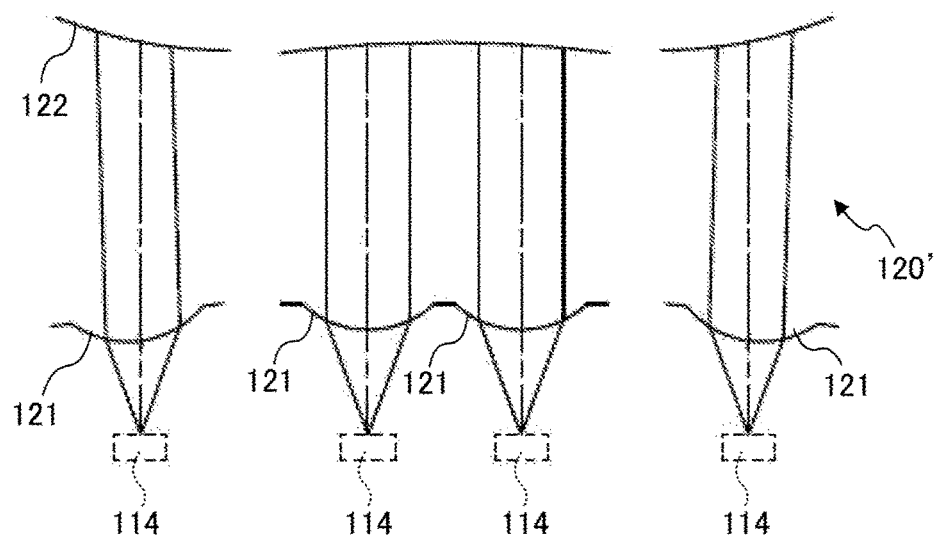
FIGS. 8A and 8B illustrate optical paths in the optical receptacle according to the comparative example after released from the mold.
Figure 8B:
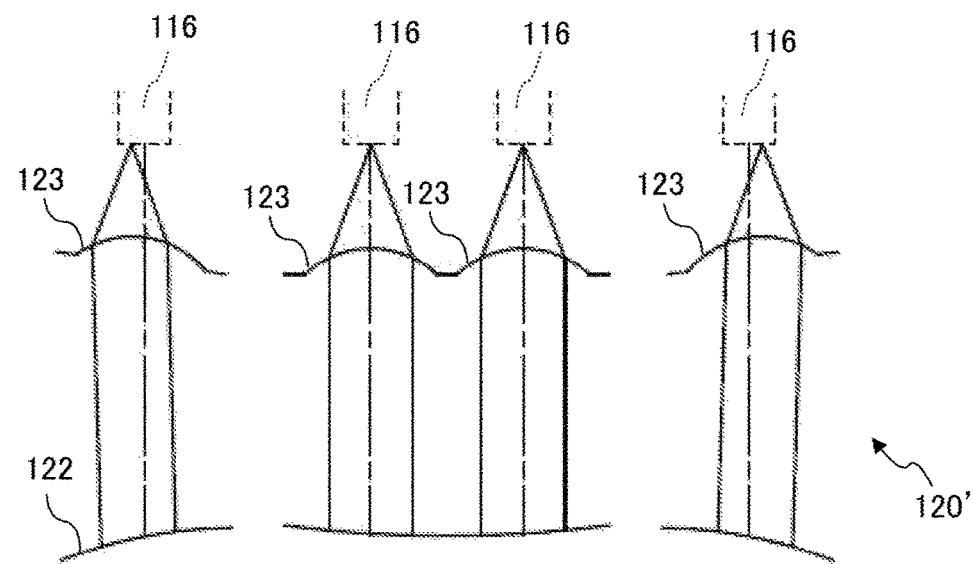

FIGS. 7A and 7B explain disposition of first optical surfaces 121 and second optical surfaces 123 of optical receptacle 120' before release from a mold, which is produced with the deformation caused by the release from a mold being not taken into consideration (hereinafter also simply referred to as optical receptacle 120' of a comparative example). FIG. 7A explains disposition of first optical surfaces 121 and FIG. 7B explains disposition of second optical surfaces 123, both in optical receptacle 120' before release from a mold. FIGS. 8A and 8B illustrate optical paths in optical receptacle 120' after released from the mold. FIG. 8A illustrates optical paths from light emitting elements 114 to third optical surface 122, and FIG. 8B illustrates optical paths from third optical surface 122 to optical transmission members 116, both in optical receptacle 120' after released from the mold. In FIGS. 8A and 8B, the leftmost first optical surface 121, the central first optical surfaces 121 and the rightmost first optical surface 121 in the drawings respectively correspond to the leftmost first optical surface 121, the central first optical surfaces 121, and the rightmost first optical surface 121 in FIG. 3B (bottom view).

As illustrated in FIGS. 7A and 7B, before release from the mold, the components of optical receptacle 120' of the comparative example are disposed such that the center-to-center distance D1 of two adjacent first optical surfaces 121 and the center-to-center distance D2 of two adjacent second optical surfaces 123 are the same as the distance D3 between the optical axes of light emitted from two adjacent light emitting elements 114 disposed so as to face first optical surfaces 121, and the distance D4 between the optical axes of light incident on two adjacent optical transmission members 116 disposed so as to face second optical surfaces 123. As described above, optical receptacle 120' of the comparative example is different from optical receptacle 120 according to the embodiment only in the disposition of first optical surfaces 121 and second optical surfaces 123.

When produced by injection molding, optical receptacle 120' of the comparative example may be produced in substantially the same manner as optical receptacle 120 according to the embodiment. The whole of optical receptacle 120' also receives stress to be bent and deformed when released from the mold in substantially the same manner as optical receptacle 120 according to the embodiment.

As illustrated in FIG. 8A, in optical receptacle 120' of the comparative example after released from the mold, light emitted from the leftmost light emitting element 114 is refracted by first optical surface 121 toward outside relative to the optical axis of the light emitted from light emitting element 114 and enters optical receptacle 120'. Since central first optical surface 121 is not largely deformed, light incident on central first optical surface 121 propagates in optical receptacle 120' along the optical axis of the light emitted from light emitting element 114. The light incident on optical receptacle 120' is reflected by third optical surface 122 toward outside relative to the optical axis of the light emitted from light emitting element 114. Light emitted from central light emitting element 114 enters optical receptacle 120' from first optical surface 121. The light incident on optical receptacle 120' is reflected by third optical surface 122 to propagate along the optical axis of the light emitted from light emitting element 114. Light emitted from the rightmost light emitting element 114 is refracted by first optical surface 121 toward inside relative to the optical axis of the light emitted from light emitting element 114 and enters optical receptacle 120'. The light incident on optical receptacle 120' is reflected by third optical surface 122 toward outside relative to the optical axis of the light emitted from light emitting element 114.

As illustrated in FIG. 8B, the light emitted from the leftmost light emitting element 114 and reflected by third optical surface 122 is largely refracted by second optical surface 123 toward outside relative to the center of the end surface of optical transmission member 116, to which the light should have reached, and is emitted. The light emitted from the central light emitting element 114 and reflected by third optical surface 122 is slightly refracted by second optical surface 123 toward outward relative to the center of the end surface of optical transmission member 116, to which the light should have reached, and is emitted. The light emitted from the rightmost light emitting element 114 and reflected by third optical surface 122 is largely refracted by second optical surface 123 toward outward relative to the center of the end surface of optical transmission member 116, to which the light should have reached, and is emitted. As described above, in optical receptacle optical receptacle 120' of the comparative example after released from the mold, all the light reaches outward positions compared to the positions to which the light should have reached; therefore, light emitting elements 114 cannot be properly connected to optical transmission members 116.

Figure 9A:
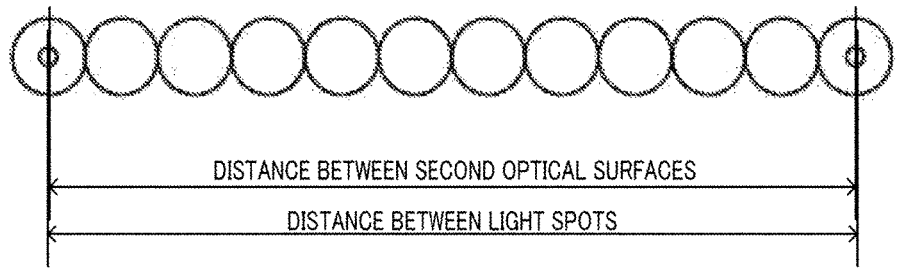
FIGS. 9A to 9C illustrate a relationship between the center-to-center distance of the second optical surfaces and the center-to-center distance of light spots.
Figure 9B:
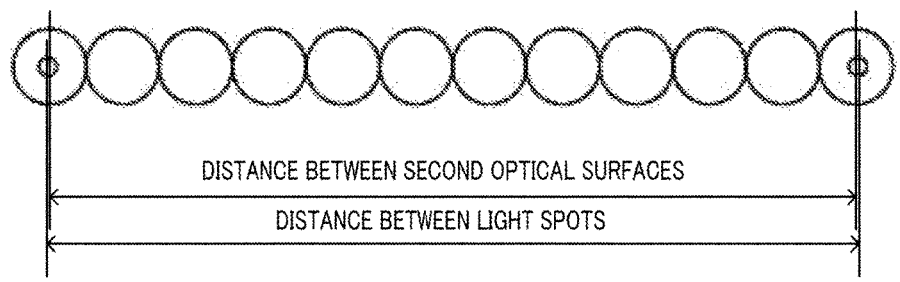
Figure 9C:
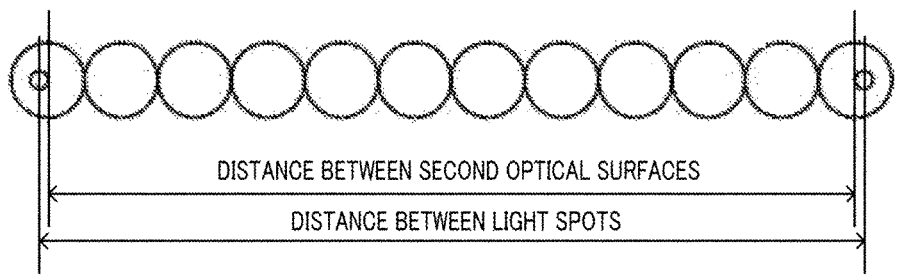

Next, a study was conducted regarding the distance between central axes of second optical surfaces 123, and the center-to-center distance of spots of light emitted from second optical surfaces 123 after released from a mold. FIGS. 9A to 9C illustrate a relationship between the distance between central axes of the second optical surfaces 123 and the center-to center distance of the light spots. As used herein, the term "light spot" means the reaching position of the center of light emitted from second optical surface 123 in the end surface of optical transmission member 116. In the study, optical receptacle 120 was used, in which the distances between optical axes of first optical surfaces 121 and between optical axes of second optical surfaces 123 before release from a mold are 2.75 mm. FIG. 9A illustrates result in a case where an optical receptacle was used, in which each distance between central axes of second optical surfaces 123 is narrower by 0.008 mm. FIG. 9B illustrates result in a case where an optical receptacle was used, in which each distance between central axes of second optical surfaces 123 is narrower by 0.006 mm. FIG. 9C illustrates result in a case where optical receptacle 120' of comparative example was used, in which the distances between central axes of second optical surfaces 123 are not adjusted. Further, as the distances between central axes of first optical surfaces 121 were made narrower in the same manner as that of second optical surfaces 123, the description thereof is omitted.

As illustrated in FIG. 9A, in the optical receptacle in which each distance between central axes of second optical surfaces 123 is narrower by 0.008 mm, the distance between second optical surfaces 123 at respective both ends was 2.744 mm, and the center-to-center distance of light spots at respective both ends was 2.747 mm. As illustrated in FIG. 9B, in the optical receptacle in which each distance between central axes of second optical surfaces 123 is narrower by 0.006 mm, the distance between second optical surfaces 123 at respective both ends was 2.746 mm, and the center-to-center distance of light spots at respective both ends was 2.750 mm. As illustrated in FIG. 9C, in optical receptacle 120' of comparative example in which the distances between central axes of second optical surfaces 123 are not adjusted, the distance between second optical surfaces 123 at respective both ends was 2.752 mm, and the center-to-center distance of light spots at respective both ends was 2.760 mm.

Although not illustrated, in the present embodiment, when the deviation width of light spot was in a range of −0.003 to 0.003 mm relative to a set position, light from light emitting element 114 can be properly connected to optical transmission member 116. As used herein, the term "deviation width of light spot" refers to the deviation width between the set position of light spot and the position of the spot of light emitted from each optical receptacle. The term "deviation width of second optical surface 123" as used herein refers to the deviation width between the center-to-center distance of end surfaces of optical transmission members 116 and the center-to-center distance of second optical surfaces 123 after released from a mold. A proportional relationship was found between the deviation width of second optical surface 123 and the deviation width of light spot. From the proportional relationship, it was found that when the deviation width of second optical surface 123 was in a range of −0.006 to 0.002 mm, light from light emitting element 114 can be properly connected to optical transmission member 116. It was also found that the center-to-center distance of second optical surfaces 123 may be made narrower by the range of −2.744 to 2.748 mm to allow the deviation width of second optical surface 123 to fall within a predetermined range. Although not illustrated, a relationship was also found, as in the present embodiment, between the deviation width of distance between central axes of second optical surfaces 123 and the deviation width of light spot in each of optical receptacles having different dimensions. Therefore, in a case where an optical receptacle having different size is produced by injection molding, the center-to-center distance of second optical surfaces 123 in the optical receptacle can be determined, which allows light emitting elements 114 to connect properly to optical transmission members 116 by studying the relationship between the deviation width of distance between central axes of second optical surfaces 123 and the deviation width of light spot. This makes possible to produce optical receptacle 120 that can properly connect light emitting elements 114 to optical transmission members 116.

Effects

As described above, optical receptacle 120 according to the present embodiment has the center-to-center distances of respective first optical surfaces 121 and second optical surfaces before release from a mold shorter than the distance between the optical axes of light emitted from light emitting elements 114, which enables light emitting elements 114 to be optically connected properly to optical transmission members 116 even when optical receptacle 120 is deformed from producing by injection molding.

In optical receptacle 120 according to the embodiment, first optical surface 121 and second optical surface 123 are convex lenses, but first optical surface 121 and second optical surface 123 may be a flat surfaces. Specifically, only first optical surface 121 may be a flat surface, or only second optical surface 123 may be a flat surface. When first optical surface 121 is formed as a flat surface, third optical surface 122 is formed to function as a concave mirror, for example. When light immediately before reaching second optical surface 123 is effectively converged by first optical surface 121 or third optical surface 122, for example, second optical surface 123 may be formed as a flat surface.

Further, optical receptacle 120 according to the embodiment may be used for an optical module on receiving side. In this case, the optical module for reception includes a plurality of light receiving elements for receiving light instead of a plurality of light emitting elements 114. The light receiving elements are disposed on the same positions as the respective corresponding light emitting elements. The optical module for reception has second optical surfaces 123 as incidence surfaces, and first optical surfaces 121 as emission surfaces. Light emitted from the end surface of optical transmission member 116 enters the optical receptacle from second optical surface 123. The light entered optical receptacle 120 is reflected by third optical surface 122 to be emitted from first optical surface 121 toward the light receiving element. In this case, a desired optical receptacle can be produced by studying the positional relationship between the distance between central axes of first optical surfaces 121 and spots of light emitted from first optical surfaces 121 as in the present embodiment.

This application claims priority based on Japanese patent Application No. 2014-004967, filed on Jan. 15, 2014, the entire contents of which including the specification and the drawings are incorporated herein by reference.

INDUSTRIAL APPLICABILITY

The optical receptacle and optical module according to the present invention are particularly advantageous for optical communications using optical transmission members.

REFERENCE SIGN LIST

10 Optical Receptacle
12 Incidence Surface
14 Reflection Surface
16 Emission Surface
18 Guide Hole
100 Optical Module
110 Photoelectric Conversion Device
112 Substrate
114 Light Emitting Element
116 Optical Transmission Member
120, 120' Optical Receptacle
121 First Optical Surface (Incidence Surface)
122 Third Optical Surface (Reflection Surface)
123 Second Optical Surface (Emission Surface)
124 Recess

The invention claimed is:

1. An optical receptacle which is produced by injection molding, disposed between a plurality of light emitting elements or a plurality of light receiving elements and a plurality of optical transmission members, and configured to optically connect the light emitting elements or the light receiving elements to end surfaces of the optical transmission members, respectively, the optical receptacle comprising:
   a plurality of first optical surfaces each configured such that light emitted from a corresponding one of the light emitting elements is incident on the first optical surface, or configured to emit light propagating inside the optical receptacle toward a corresponding one of the light receiving elements;
   a plurality of second optical surfaces each configured to emit the light incident on the first optical surface toward an end surface of a corresponding one of the optical transmission members, or configured such that light from a corresponding one of the optical transmission members is incident on the second optical surface;
   a third optical surface configured to reflect the light incident on the first optical surface toward the second optical surface, or configured to reflect the light incident on the second optical surface toward the first optical surface; and
   a plurality of recesses formed on a surface where the plurality of second optical surfaces are disposed,
   wherein, before release from a mold in the injection molding, a center-to-center distance of an adjacent two of the first optical surfaces and a center-to-center distance of an adjacent two of the second optical surfaces are shorter than a distance between optical axes of light emitted from an oppositely-disposed adjacent two of the light emitting elements, or a distance between optical axes of light emitted from an oppositely-disposed adjacent two of the optical transmission members, and
   after release from the mold, a center-to-center distance of the adjacent two first optical surfaces and a center-to-center distance of the adjacent two second optical surfaces are shorter than the distance between the optical axes of the light emitted from the oppositely-disposed adjacent two light emitting elements or the distance between the optical axes of the light emitted from the oppositely-disposed adjacent two optical transmission members.

2. An optical module comprising:
   a substrate on which the plurality of light emitting elements or the plurality of light receiving elements are disposed, and
   the optical receptacle according to claim 1 disposed on the substrate.

* * * * *